(12) United States Patent
Takahashi et al.

(10) Patent No.: US 9,219,113 B2
(45) Date of Patent: Dec. 22, 2015

(54) SEMICONDUCTOR DEVICE HAVING BREAKDOWN VOLTAGE ENHANCEMENT STRUCTURE

(71) Applicant: Mitsubishi Electric Corporation, Tokyo (JP)

(72) Inventors: Takuya Takahashi, Tokyo (JP); Atsushi Narazaki, Tokyo (JP); Tetsuo Takahashi, Tokyo (JP)

(73) Assignee: Mitsubishi Electric Corporation, Toyo (JP)

( * ) Notice: Subject to any disclaimer, the term of this patent is extended or adjusted under 35 U.S.C. 154(b) by 0 days.

(21) Appl. No.: 14/242,040

(22) Filed: Apr. 1, 2014

(65) Prior Publication Data

US 2014/0367737 A1  Dec. 18, 2014

(30) Foreign Application Priority Data

Jun. 12, 2013 (JP) .................................. 2013-123779

(51) Int. Cl.
*H01L 29/06* (2006.01)
*H01L 29/66* (2006.01)
(Continued)

(52) U.S. Cl.
CPC ........ *H01L 29/0615* (2013.01); *H01L 29/1095* (2013.01); *H01L 29/66348* (2013.01); *H01L 29/7397* (2013.01)

(58) Field of Classification Search
CPC .............. H01L 29/063; H01L 29/0619; H01L 29/0623; H01L 29/0634; H01L 29/0638; H01L 29/0661; H01L 29/0834; H01L 29/0878; H01L 29/78; H01L 29/7393; H01L 29/66325; H01L 2924/13055
See application file for complete search history.

(56) References Cited

U.S. PATENT DOCUMENTS 3,935,587 A * 1/1976 Ostop et al. .................... 257/47
4,407,059 A * 10/1983 Sasaki .......................... 438/301
4,602,266 A * 7/1986 Coe .............................. 257/495
(Continued)

FOREIGN PATENT DOCUMENTS

JP    61-84830 A    4/1986
JP    01-270346 A   10/1989
(Continued)

OTHER PUBLICATIONS

An Office Action; "Notice of Reasons for Rejection," issued by the Japanese Patent Office on Oct. 27, 2015, which corresponds to Japanese Patent Application No. 2013-123779 and is related to U.S. Appl. No. 14/242,040; with English language translation.

*Primary Examiner* — Ida M Soward
(74) *Attorney, Agent, or Firm* — Studebaker & Brackett PC

(57) ABSTRACT

A semiconductor device includes a substrate of a first conductivity type, a first impurity region of a second conductivity type formed on a top surface side of the substrate, a second impurity region of the second conductivity type formed on the top surface side of the substrate and in contact with the first impurity region, the second impurity region laterally surrounding the first impurity region and having a greater depth than the first impurity region, as viewed in cross-section, and a breakdown voltage enhancing structure of the second conductivity type formed to laterally surround the second impurity region. A boundary between the first and second impurity regions has a maximum impurity concentration equal to or less than that of the second impurity region, and a current is applied between a top surface and a bottom surface of the substrate.

8 Claims, 18 Drawing Sheets

(51) Int. Cl.
*H01L 29/10* (2006.01)
*H01L 29/739* (2006.01)

(56) References Cited

U.S. PATENT DOCUMENTS

| | | | |
|---|---|---|---|
| 4,672,738 A | | 6/1987 | Stengl et al. |
| 5,347,155 A | * | 9/1994 | Ludikhuize .................. 257/492 |
| 5,378,920 A | * | 1/1995 | Nakagawa et al. ........... 257/487 |
| 5,387,553 A | * | 2/1995 | Moksvold et al. ............ 438/339 |
| 5,430,311 A | * | 7/1995 | Murakami et al. ............ 257/146 |
| 5,446,302 A | * | 8/1995 | Beigel et al. .................. 257/355 |
| 5,541,123 A | * | 7/1996 | Williams et al. .............. 438/202 |
| 5,552,625 A | * | 9/1996 | Murakami et al. ............ 257/409 |
| 5,969,400 A | | 10/1999 | Shinohe et al. |
| 6,215,167 B1 | * | 4/2001 | Park ............................. 257/488 |
| 6,429,501 B1 | * | 8/2002 | Tsuchitani et al. ........... 257/493 |
| 7,586,161 B2 | * | 9/2009 | Pfirsch .......................... 257/378 |
| 7,642,599 B2 | * | 1/2010 | Ninomiya et al. ............. 257/355 |
| 8,278,728 B2 | * | 10/2012 | Murshid ....................... 257/448 |
| 8,610,216 B2 | * | 12/2013 | Galy et al. .................... 257/360 |
| 8,749,017 B2 | * | 6/2014 | Lu ................................. 257/493 |
| 8,791,511 B2 | * | 7/2014 | Jonishi ......................... 257/288 |
| 8,847,275 B2 | * | 9/2014 | Jimenez et al. ............... 257/119 |
| 2008/0315297 A1 | * | 12/2008 | Takashita et al. ............ 257/328 |
| 2012/0122305 A1 | * | 5/2012 | Zhang et al. ................. 438/526 |
| 2013/0037852 A1 | * | 2/2013 | Tamaki ........................ 257/139 |
| 2013/0140582 A1 | * | 6/2013 | Kawakami et al. ............ 257/76 |
| 2013/0153954 A1 | * | 6/2013 | Takahashi ..................... 257/139 |
| 2013/0161645 A1 | * | 6/2013 | Takahashi ..................... 257/77 |
| 2014/0197422 A1 | * | 7/2014 | Wada et al. .................... 257/77 |
| 2014/0353678 A1 | * | 12/2014 | Kawakami et al. ............ 257/76 |

FOREIGN PATENT DOCUMENTS

| | | |
|---|---|---|
| JP | H05-063202 A | 3/1993 |
| JP | 05-110118 A | 4/1993 |
| JP | 07-273325 A | 10/1995 |
| JP | H08-172057 A | 7/1996 |
| JP | 08-316480 A | 11/1996 |
| JP | 2005-079359 A | 3/2005 |
| JP | 2010-003841 A | 1/2010 |

* cited by examiner

Comparative example
(PRIOR ART)

Comparative example
(PRIOR ART)

Comparative example
(PRIOR ART)

Comparative example
(PRIOR ART)

SEMICONDUCTOR DEVICE HAVING BREAKDOWN VOLTAGE ENHANCEMENT STRUCTURE

BACKGROUND OF THE INVENTION

1. Field of the Invention

The present invention relates to a semiconductor device for use, e.g., in high current applications, and also relates to a method of manufacture thereof.

2. Background Art

Japanese Laid-Open Patent Publication No. H07-273325 shows a cross-section of an IGBT (see FIG. 5 of this publication). This IGBT has a p-base region and guard rings, with the guard rings being formed to surround the periphery of the p-base region. A guard ring is a known breakdown voltage enhancing structure used to enhance the breakdown voltage of a semiconductor device.

In some semiconductor devices, a PN junction having a high degree of curvature is formed between an active region such as a base region through which the main current passes and the substrate, which may result in a decrease in the breakdown voltage of the device. In order to prevent this from occurring, it is desirable that a well region of the same conductivity type as the active region be formed in contact with the periphery of the active region. That is, the well region is formed between the active region and the adjacent breakdown voltage enhancing structure.

The active region and the well region typically have different impurity concentrations and different depths, since they have different functions, as described above. Therefore, the active region and the well region may be formed by separate ion implantation steps using different masks. That is, in order to form the active and well regions, the substrate may be ion-implanted twice. In such cases, the impurity-implanted region for forming the active region and that for forming the well region are formed to partially overlap each other thereby creating an implanted overlap region so that the active region will be fully in contact with the well region. It has been found, however, that in some cases the impurity concentration of the implanted overlap region becomes excessively high, with the result that the amount of holes implanted into the substrate is increased and that the recovery current flows primarily through the implanted overlap region, resulting in a decrease in the safe operating area (SOA) of the semiconductor device.

SUMMARY OF THE INVENTION

The present invention has been made to solve the above problems. It is, therefore, an object of the present invention to provide a semiconductor device in which the boundary between the active region and the well region has a relatively low impurity concentration. Another object of the present invention is to provide a method of manufacturing such a semiconductor device.

The features and advantages of the present invention may be summarized as follows.

According to one aspect of the present invention, a semiconductor device includes a substrate of a first conductivity type, a first impurity region of a second conductivity type formed on a top surface side of the substrate, a second impurity region of the second conductivity type formed on the top surface side of the substrate and in contact with the first impurity region, the second impurity region laterally surrounding the first impurity region and having a greater depth than the first impurity region, as viewed in cross-section, and a breakdown voltage enhancing structure of the second conductivity type formed to laterally surround the second impurity region. A boundary between the first and second impurity regions has a maximum impurity concentration equal to or less than that of the second impurity region, and a current is applied between a top surface and a bottom surface of the substrate.

According to another aspect of the present invention, a method of manufacturing a semiconductor device includes a step wherein a mask having a first portion and a second portion is formed on a top surface of a substrate of a first conductivity type, the first portion having first openings, the second portion having an annular second opening surrounding the first portion, a step wherein the substrate is implanted with impurities of a second conductivity type through the first openings and the second opening, and a thermal diffusion step wherein impurities which have been implanted through the first openings are thermally diffused so as to form a first impurity region while impurities which have been implanted through the second opening are thermally diffused so as to form a second impurity region which laterally surrounds and is in contact with the first impurity region and which has a greater depth than the first impurity region, as viewed in cross-section. A boundary between the first and second impurity regions has a maximum impurity concentration equal to or less than that of the second impurity region.

According to another aspect of the present invention, a method of manufacturing a semiconductor device includes a step of forming a mask on a top surface of a substrate of a first conductivity type, the mask having first openings exposing a central portion of the substrate, a step of implanting the central portion with a first impurity of the first conductivity type using the mask, a step of removing the mask, a step of implanting the central portion and a surrounding outer portion of the substrate with a second impurity of a second conductivity type in such a manner that the second impurity is present in the central portion and the surrounding outer portion in a higher concentration than the first impurity is present in the central portion, and a thermal diffusion step of thermally diffusing the first and second impurities so as to form a first impurity region of the second conductivity type in the central portion and form a second impurity region of the second conductivity type which laterally surrounds and is in contact with the first impurity region and which has a greater depth than the first impurity region, as viewed in cross-section. A boundary between the first and second impurity regions has a maximum impurity concentration equal to or less than that of the second impurity region.

Other and further objects, features and advantages of the invention will appear more fully from the following description.

DETAILED DESCRIPTION OF THE PREFERRED EMBODIMENTS

Figure 1:
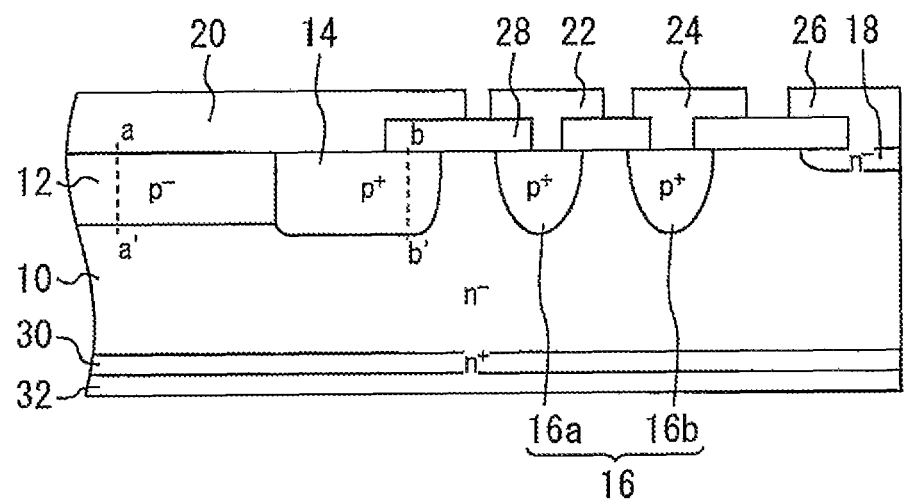
FIG. 1 is a cross-sectional view of a portion of a semiconductor device in accordance with a first embodiment of the present invention.

Semiconductor devices and methods of manufacturing a semiconductor device in accordance with embodiments of the present invention will be described with reference to the accompanying drawings. Throughout the specification the same or corresponding components are designated by the same reference numerals and may be described only once.

First Embodiment

FIG. 1 is a cross-sectional view of a portion of a semiconductor device in accordance with a first embodiment of the present invention. This semiconductor device is a diode. (It should be noted that the semiconductor devices of the subsequently described embodiments are also diodes unless otherwise specifically noted.) This semiconductor device includes a substrate 10 of a first conductivity type (herein n-type) formed of a silicon material. That is, the substrate 10 is a semiconductor substrate. A first impurity region 12 of a second conductivity type (herein p-type) is formed on the top surface side of the substrate 10. The first impurity region 12 functions as an anode region.

A p-type second impurity region 14 is also formed on the top surface side of the substrate 10 and is in contact with the first impurity region 12. The second impurity region 14 has a higher impurity concentration than the first impurity region 12 and hence serves as a well region in which only a relatively small amount of heat is generated when a recovery current flows through the semiconductor device. The second impurity region 14 is formed to have a greater depth than the first impurity region 12, as viewed in cross-section. The boundary between the first impurity region 12 and the second impurity region 14 has a maximum impurity concentration equal to or less than that of the second impurity region 14.

A p-type breakdown voltage enhancing structure 16 is formed in the top surface side of the substrate 10. The breakdown voltage enhancing structure 16 includes guard rings 16a and 16b. An n-type channel stopper 18 is formed in the outer edge portion of the top surface of the substrate 10.

An anode electrode 20 is formed on the first impurity region 12 and the second impurity region 14. Field plates 22 and 24 are formed on the guard rings 16a and 16b, respectively. A field plate 26 is formed on the channel stopper 18. An interlayer insulating film 28 is formed to electrically isolate the field plates 22, 24, and 26 from each other and from the anode electrode 20.

An n$^+$-layer 30 is formed on the bottom surface side of the substrate 10. A cathode electrode 32 is also formed on the bottom surface side of the substrate 10 and is in contact with the n$^+$-layer 30. Thus, the semiconductor device of the first embodiment is configured as a diode wherein a current is applied between the top and bottom surfaces of the substrate 10.

Figure 2:
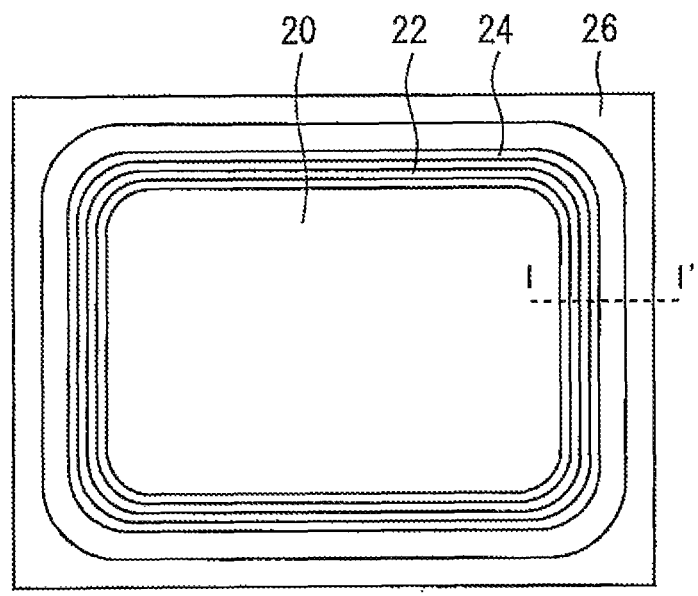
FIG. 2 is a plan view of the semiconductor device of the first embodiment.
Figure 3:
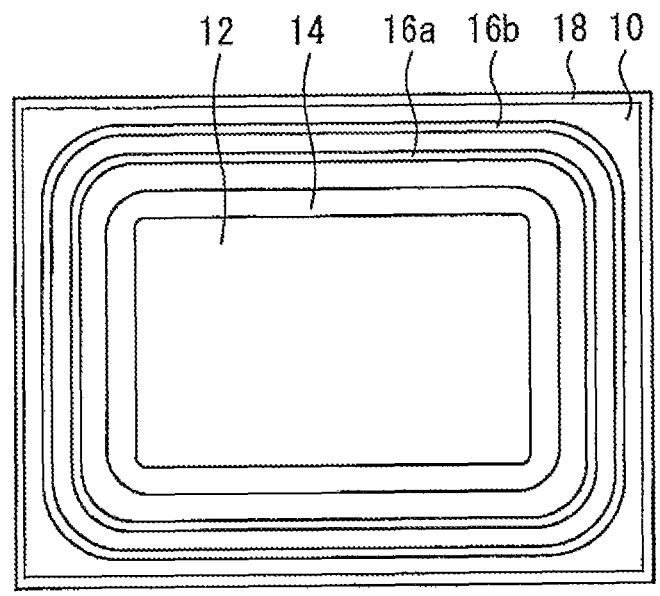
FIG. 3 is a plan view showing first impurity region and second impurity region.

FIG. 2 is a plan view of the semiconductor device of the first embodiment. The anode electrode 20 is encircled by the field plates 22, 24, and 26, which have an annular shape. FIG. 1, described above, is a cross-sectional view taken along line I-I' of FIG. 2. FIG. 3 is a plan view of the semiconductor device, with the anode electrode 20, the field plates 22, 24, and 26, and the interlayer insulating film 28 removed for convenience of illustration. The first impurity region 12 is formed in the central portion of the substrate, as viewed in plan. The second impurity region 14 laterally surrounds and is in contact with the first impurity region 12. The guard rings 16a and 16b laterally surround the second impurity region 14.

Figure 4:
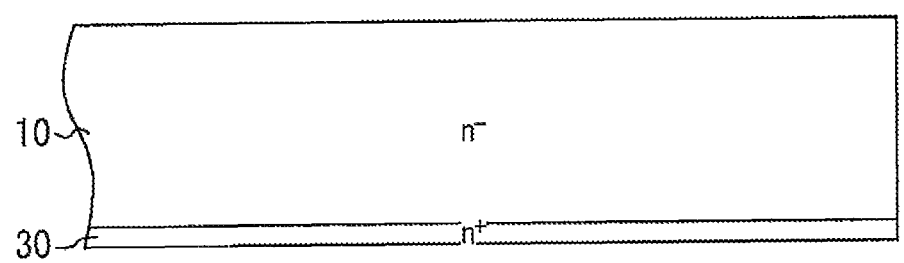
FIG. 4 shows an n+-layer on the bottom surface of a substrate.
Figure 5:
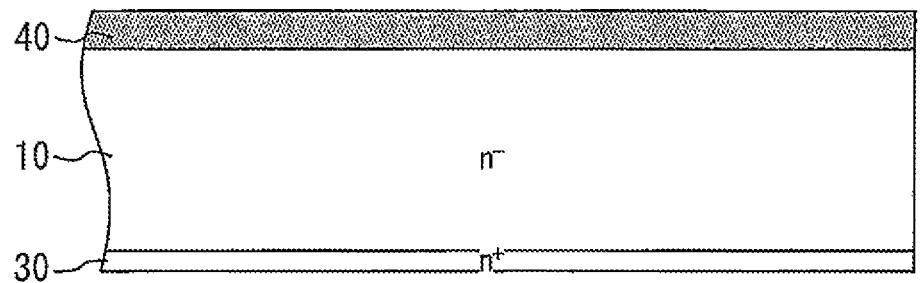
FIG. 5 shows a mask material formed on the top surface of the substrate.

A method of manufacturing a semiconductor device in accordance with the first embodiment will be described. FIGS. 4 and 5 are cross-sectional views of portions of partially completed semiconductor devices, which portions correspond to the portion of the semiconductor device of the first embodiment shown in FIG. 1. The method begins by forming an n$^+$-layer 30 on the bottom surface of a substrate 10, as shown in FIG. 4. Next, a mask material 40 is formed on the top surface of the substrate 10, as shown in FIG. 5. The mask material 40 is, e.g., a resist material or a nitride film.

Figure 6:
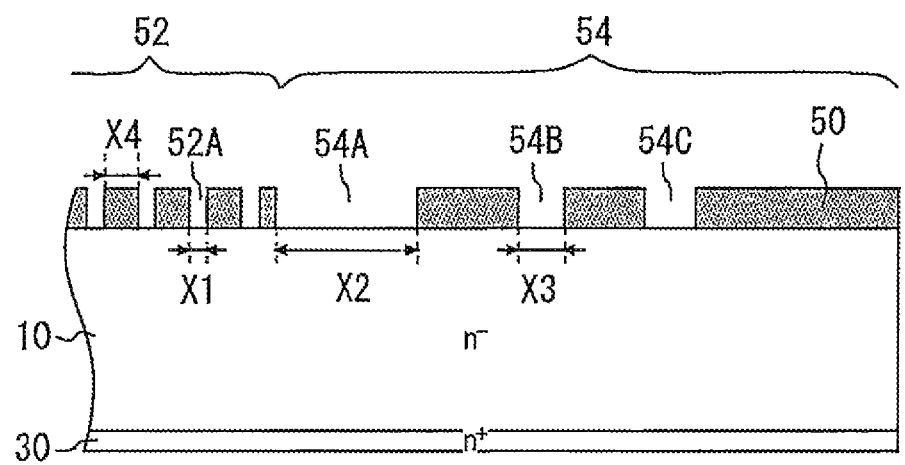
FIG. 6 is a cross-sectional view of the partially completed semiconductor device shown in FIG. 5.
Figure 7:
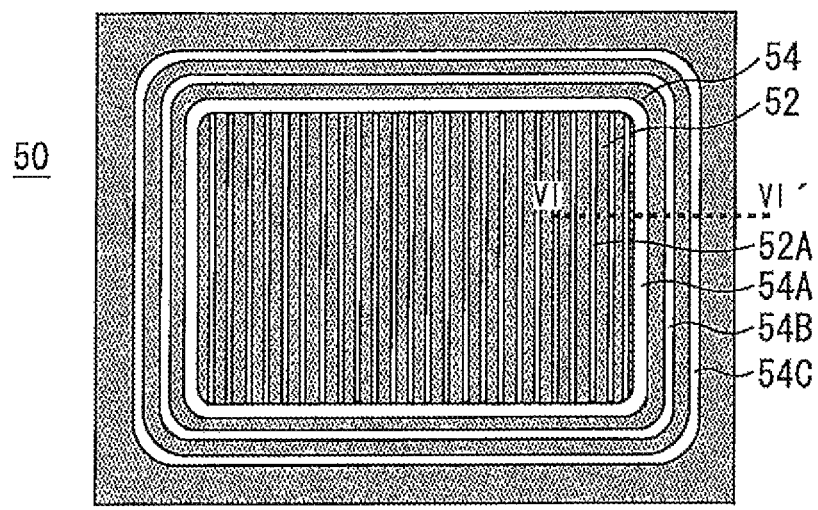
FIG. 7 is a plan view of the mask.

The mask material 40 is then patterned. Specifically, if the mask material 40 is a resist material, then it is patterned by photolithography (including resist coating, exposure, and development). If, on the other hand, the mask material 40 is a nitride film, then it is patterned by photolithography and etching. FIG. 6 is a cross-sectional view of the partially completed semiconductor device shown in FIG. 5 after the mask material 40 has been patterned to form a mask 50. FIG. 7 is a plan view of the mask 50. FIG. 6 is a cross-sectional view taken along line VI-VI' of FIG. 7. As shown in FIG. 6, the mask 50 may be divided into two portions: a first portion 52 and a second portion 54, which are formed on the top surface of the substrate 10. The first portion 52 is used to form an anode region. The second portion 54 is used to form a well region and a breakdown voltage enhancing structure. The first portion 52 includes a plurality of spaced-apart elongated first openings 52A (forming a stripe) which define a plurality of strip sections (or mask patterns) therebetween, as shown in FIG. 7. The aperture ratio r1 of the first portion 52 is W2/(W1+W2), where W1 is the sum of the widths of the strip sections and W2 is the sum of the widths of the first openings 52A. The widths of the strip sections are such that impurities which have been introduced through each first opening 52A laterally diffuse and meet those from the adjacent first openings 52A (that is, the surface of the substrate 10 under the first portion 52 is fully diffused with impurities which have been introduced through the first openings 52A) when the device is heat treated (described later in detail).

The second portion 54 has an annular second opening 54A having a greater width than the first openings 52A. The second opening 54A is formed to surround the first portion 52. The second portion 54 also has third openings 54B and 54C. The third openings 54B and 54C are formed to have an annular shape and surround the second opening 54A. It should be noted that the widths of the annular mask patterns between the second opening 54A and the third opening 54B and between the third openings 54B and 54C are such that the impurities which have been introduced through these openings do not meet due to lateral diffusion during the heat treatment described later.

As shown in FIG. 6, the width X2 of the second opening 54A is greater than the width X1 of the first openings 52A and the width X3 of the third openings 54B and 54C, and the width X3 of the third openings 54B and 54C is greater than the width X1 of the first openings 52A. Further, each strip section of the first portion 52 has a width X4. It should be noted that with respect to the width X3 of the third openings 54B and 54C, the present embodiment requires only that it be optimum for forming guard rings. Therefore, the relations of the width X3 of these third openings to the width X2 of the second opening 54A and to the width X1 of the first openings 52A may be different from those described above.

Figure 8:
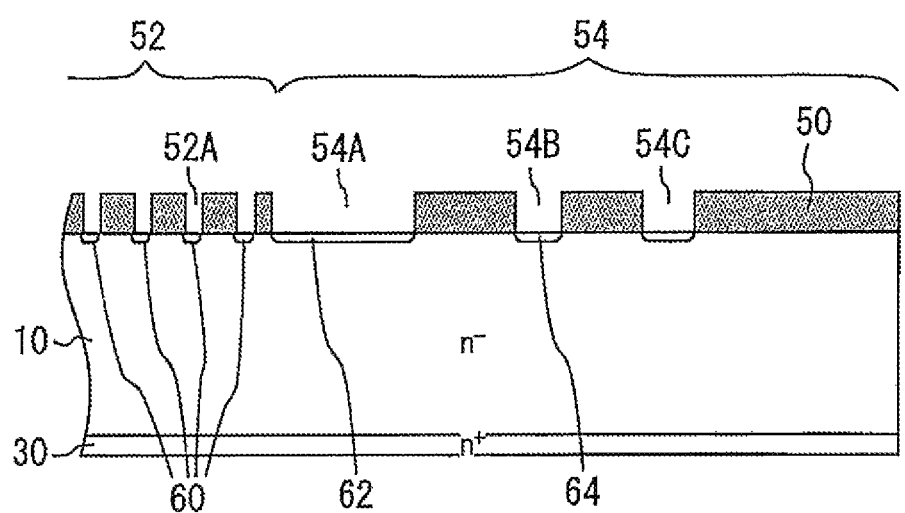
FIG. 8 is a cross-sectional view of a portion of the partially completed semiconductor device after the ion implantation.

Next, the substrate 10 is implanted with p-type impurities using the mask 50. FIG. 8 is a cross-sectional view of a portion of the partially completed semiconductor device shown in FIG. 6 after the substrate 10 has been ion-implanted with boron, etc. As a result of this ion implantation, implanted regions 60, 62, and 64, which later serve as diffusion sources, are formed in the surface portions of the substrate 10 exposed by the openings of the mask 50.

Specifically, the implanted regions 60 are formed by implanting the substrate 10 with impurities through the first openings 52A. The implanted region 62 is formed by implanting the substrate 10 with impurities through the second opening 54A. The implanted regions 64 are formed by implanting the substrate 10 with impurities through the third openings 54B and 54C. These implanted regions are formed simultaneously in one implantation step.

It should be noted that in this ion implantation the angle of incidence of ions is preferably approximately 7 degrees relative to the normal to the surface of the substrate 10 in order to avoid channeling.

Figure 9:
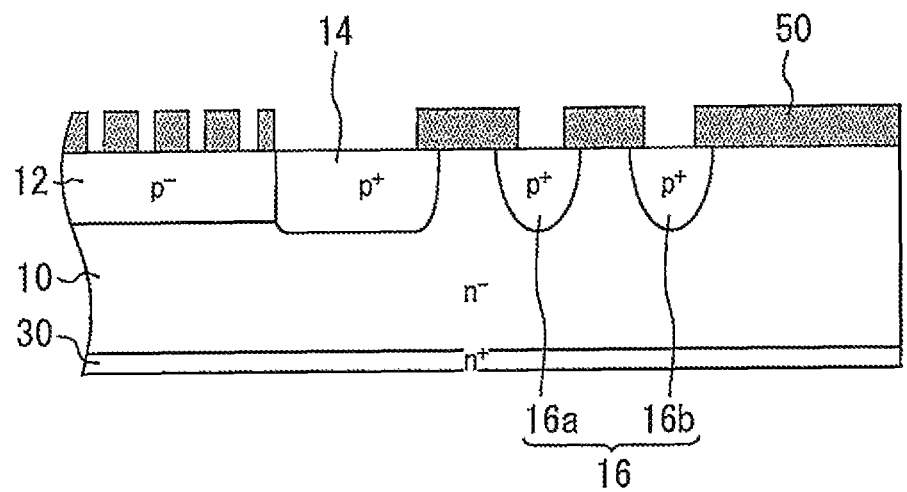
FIG. 9 is a cross-sectional view of a portion of the partially completed semiconductor device after thermal diffusion step.

A thermal diffusion step is then performed to diffuse impurities in predetermined regions in the substrate 10 by heating the substrate 10. FIG. 9 is a cross-sectional view of a portion of the partially completed semiconductor device shown in FIG. 8 after the thermal diffusion step has been completed. In this thermal diffusion step, the impurities which have been implanted into the substrate 10 through the first openings 52A and the second opening 54A are thermally diffused to form a first impurity region 12 and a second impurity region 14, respectively. Further, the impurities which have been implanted into the substrate 10 through the third openings 54B and 54C are thermally diffused to form guard rings 16a and 16b. Thus in this thermal diffusion step, the first impurity region 12, the second impurity region 14, and the guard rings 16a and 16b are formed simultaneously by heat treating the substrate 10 once.

Let R represent the amount of impurities which have been implanted in the implanted region 62 per unit area in the impurity implantation step, this amount being equal to the dose amount. (The implanted region 62 is later diffused to form the second impurity region 14.) Then the amount of impurities which have been implanted in the portion of the substrate 10 under the first portion 52 of the mask 50 per unit area is r1*R, where r1 is the aperture ratio of the first portion 52. It should be noted that this portion of the substrate 10 includes the implanted regions 60, which are later diffused to form the first impurity region 12. That is, the amount of impurities which have been implanted in the second impurity region 14 per unit area is greater than the amount of impurities which have been implanted in the first impurity region 12 per unit area. Therefore, the second impurity region 14 has a higher impurity concentration than the first impurity region 12 and has a greater depth than the first impurity region 12, as viewed in cross-section. Since in the thermal diffusion step the implanted regions 60 and 62 diffuse laterally as well as vertically, the first impurity region 12 and the second impurity region 14 are in contact with each other. The boundary between the first impurity region 12 and the second impurity region 14 has a maximum impurity concentration equal to or less than that of the second impurity region 14.

Figure 10:
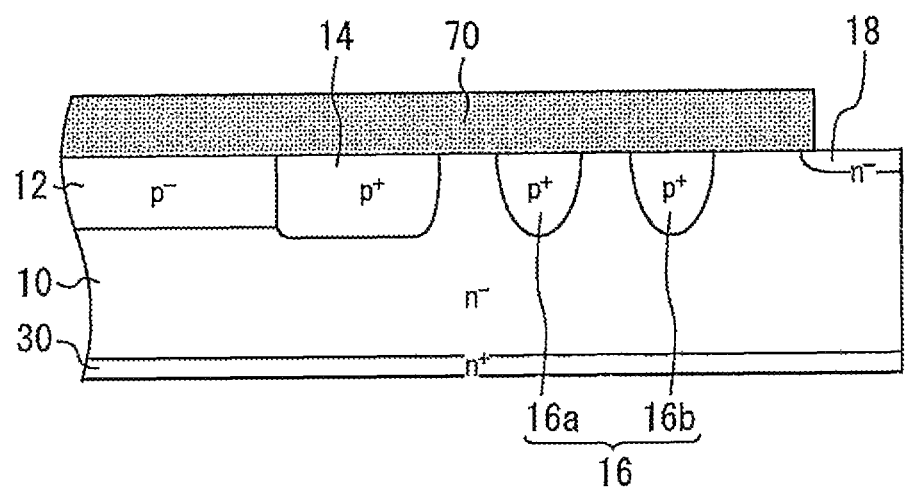
FIG. 10 is a cross-sectional view of a portion of the partially completed semiconductor device after the channel stopper has been formed.

Next, a channel stopper 18 is formed. FIG. 10 is a cross-sectional view of a portion of the partially completed semiconductor device shown in FIG. 9 after the channel stopper has been formed. Specifically in this step, first the mask 50 is removed from on top of the substrate 10, and then a patterned mask 70 is formed on the substrate 10. Further, an n-type impurity such as phosphorus is implanted in the substrate 10 so as to form the channel stopper 18. The mask 70 is then removed after completion of the formation of the channel stopper 18.

Figure 11:
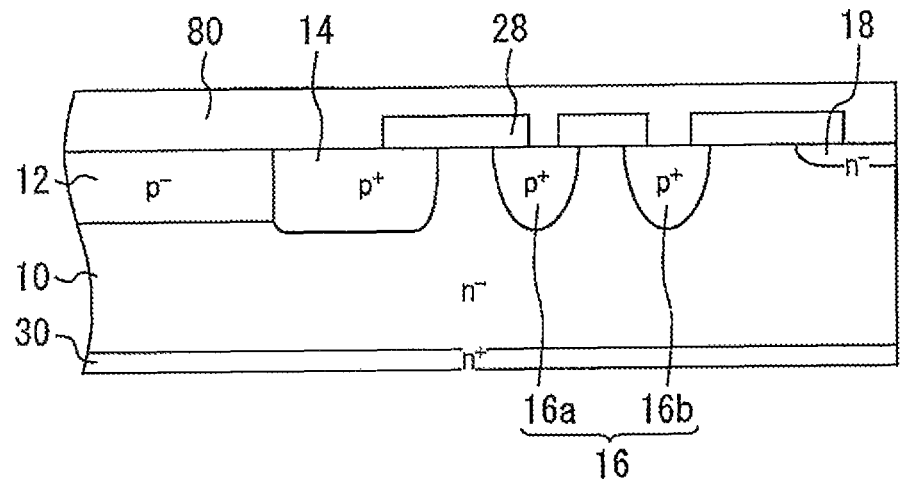
FIG. 11 is a cross-sectional view of a portion of the partially completed semiconductor device after the interlayer insulating film and the metal film have been formed.
Figure 12:
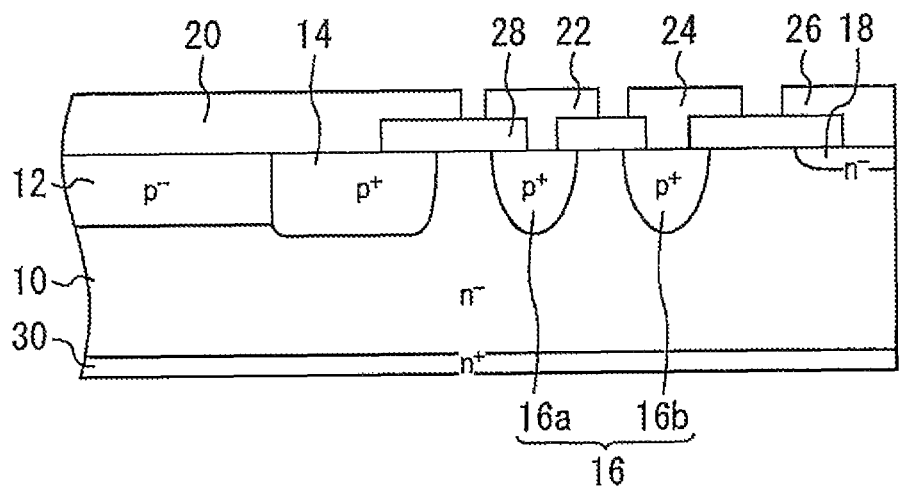
FIG. 12 is a cross-sectional view of a portion of the partially completed semiconductor device after the anode and the field plates have been formed.

An interlayer insulating film 28 and a metal film 80 are then formed. FIG. 11 is a cross-sectional view of a portion of the partially completed semiconductor device shown in FIG. 10 after the interlayer insulating film 28 and the metal film 80 have been formed. Specifically in this step, first an interlayer insulating film material is deposited on the substrate 10 by CVD, etc., and then subjected to photolithography and etching so as to form the interlayer insulating film 28. The metal film 80 is then deposited by sputtering. The metal film 80 is, e.g., aluminum.

Next, the metal film 80 is patterned to form an anode electrode 20 and field plates 22, 24, and 26. The anode electrode 20 is formed at least on the first impurity region 12. FIG.

12 is a cross-sectional view of a portion of the partially completed semiconductor device shown in FIG. 11 after the anode and the field plates have been formed. Specifically in this step, the metal film 80 is subjected to photolithography and etching so as to form the anode electrode 20 and the field plates 22, 24, and 26. Lastly, a metal film is sputtered onto the bottom surface side of the substrate 10 to form a cathode electrode 32, thus completing the manufacture of the semiconductor device shown in FIG. 1.

Figure 13:
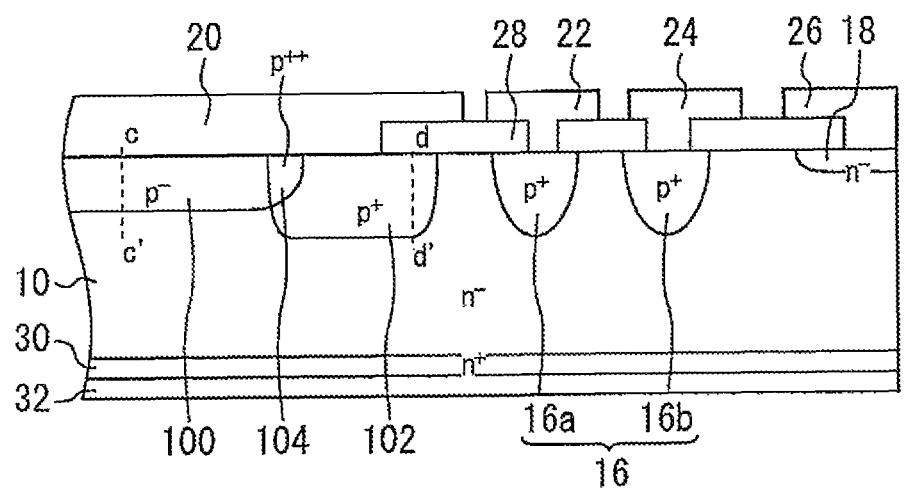
FIG. 13 is a cross-sectional view of a portion of comparative semiconductor device.

Before describing the advantages of the present invention, a comparative conventional semiconductor device will be described. FIG. 13 is a cross-sectional view of a portion of this comparative semiconductor device. The comparative semiconductor device has a first impurity region 100 and a second impurity region 102 (which correspond to the first impurity region 12 and the second impurity region 14, respectively, of the first embodiment), and a boundary region 104 having a higher impurity concentration than these impurity regions is formed between them. In the manufacture of the comparative semiconductor device, the implanted region for forming the first impurity region 102 and that for forming the second impurity region 104 are formed by separate steps so that the impurity regions will have different impurity concentrations.

Figure 14A:
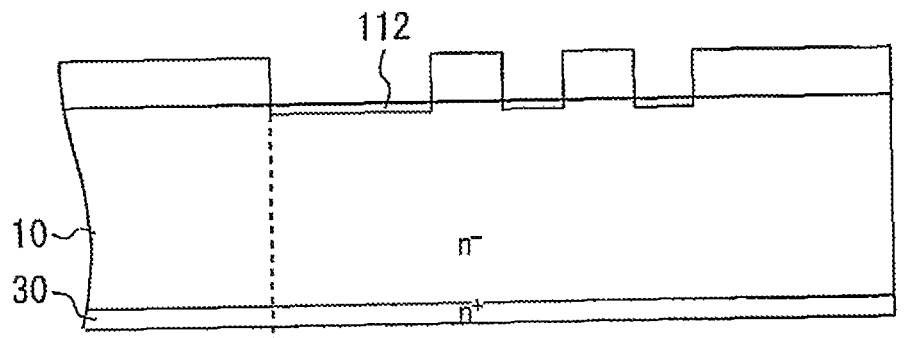
FIG. 14A shows an implanted region.
Figure 14B:
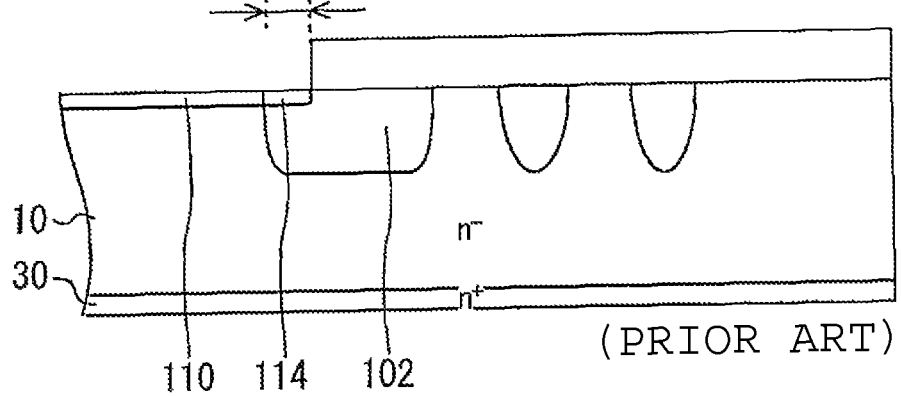
FIG. 14B shows another implanted region.
Figure 14C:
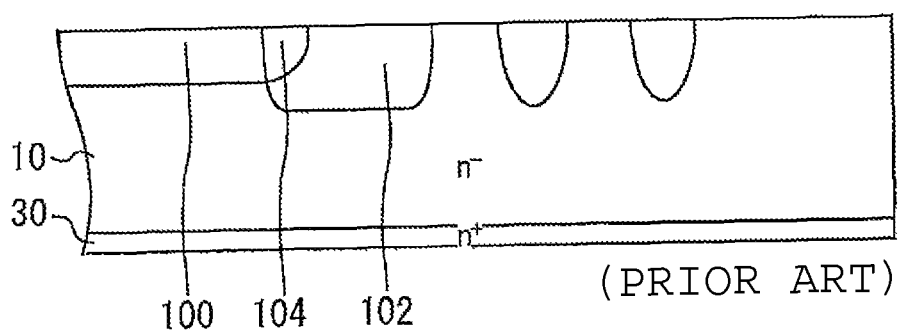
FIG. 14C shows the first impurity region and the boundary region.

FIG. 14 includes FIGS. 14A to 14C, which are cross-sectional views of portions of partially completed semiconductor devices, showing a method of manufacturing the first impurity region 100 and the second impurity region 102 of the comparative semiconductor device. This manufacturing method begins by forming an implanted region 112 in a substrate 10, as shown in FIG. 14A. Next, impurities are thermally diffused from the implanted region 112 so as to form the second impurity region 102. An implanted region 110 is then formed in the substrate 10, as shown in FIG. 14B. A portion of the implanted region 110 overlaps a portion of the second impurity region 102, forming an implanted overlap region 114. Then as shown in FIG. 14C, impurities are thermally diffused from the implanted region 110 so as to form the first impurity region 100 and the boundary region 104. The reason for forming the boundary region 104 is to accommodate process variations in the separate ion implantation and thermal diffusion steps in which the first impurity region 100 and the second impurity region 102 are formed, and thereby to ensure that these impurity regions are in contact with each other. It should be noted that the implanted overlap region 114 is transformed into the boundary region 104 by a thermal diffusion step, as described above.

Such conventional semiconductor devices, however, have been found disadvantages in that, due to the presence of the boundary region 104, the amount of holes implanted into the substrate 10 is increased and the recovery current flows primarily through the boundary region 104, resulting in a decrease in the SOA of the semiconductor device.

Figure 15:
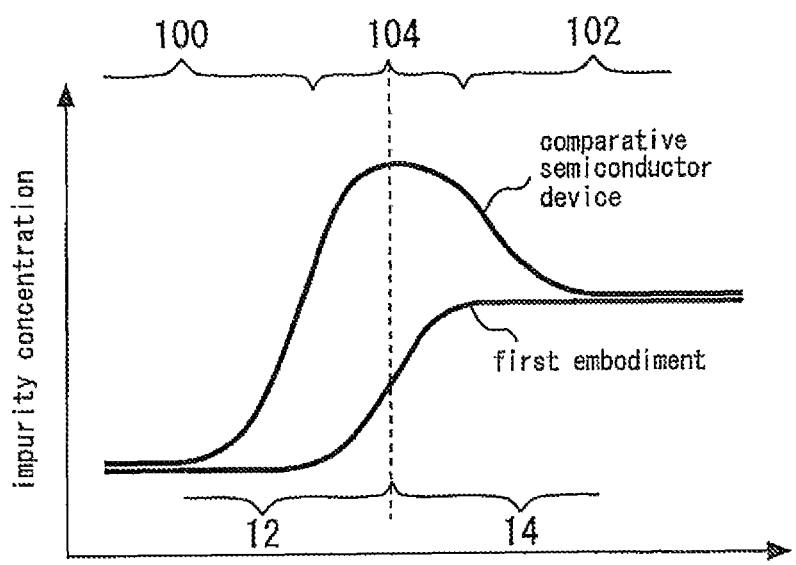
FIG. 15 is a graph illustrating the impurity concentration at a given depth.

A first feature of the semiconductor device and method of manufacturing a semiconductor device in accordance with the first embodiment is that the boundary between the first impurity region 12 and the second impurity region 14 has a maximum impurity concentration equal to or less than that of the second impurity region 14. This will be described with reference to FIGS. 15 to 17. FIG. 15 is a graph illustrating the impurity concentration at a given depth in the first impurity region 100, the boundary region 104, and the second impurity region 102 of the comparative semiconductor device as a function of lateral position, and also illustrating the impurity concentration at a given depth in the first impurity region 12 and the second impurity region 14 of the semiconductor device of the first embodiment as a function of lateral position. As shown, in the comparative semiconductor device the maximum impurity concentration occurs in the boundary region 104, whereas in the semiconductor device of the first embodiment the maximum impurity concentration occurs in the second impurity region 14.

Figure 16:
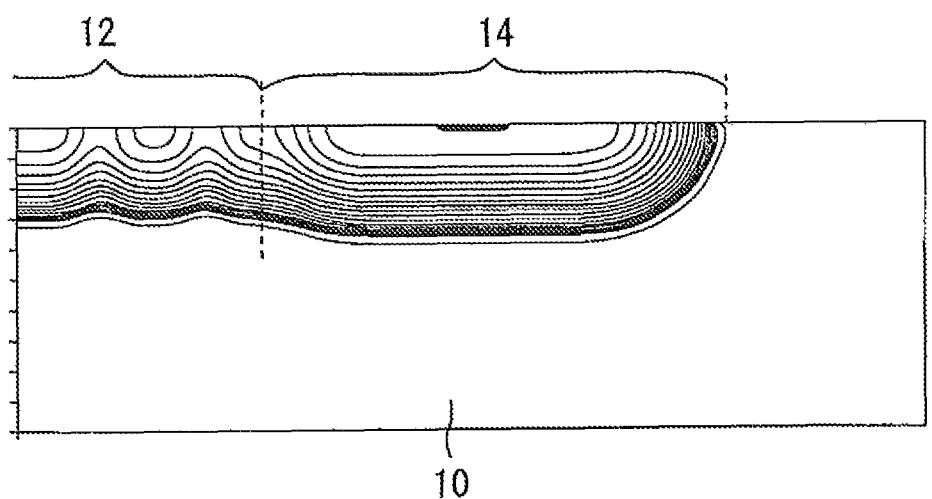
FIG. 16 shows a simulation result of the semiconductor device of first embodiment.
Figure 17:
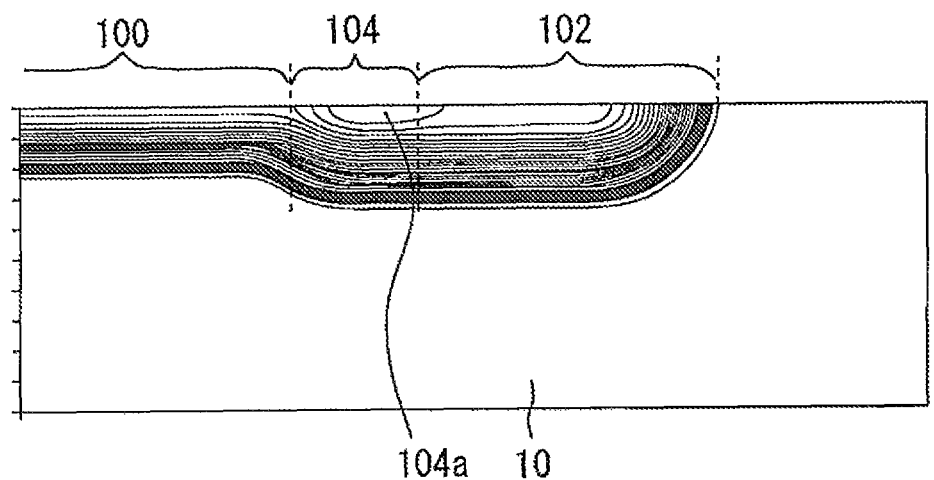
FIG. 17 shows a simulation result of the semiconductor device of comparative semiconductor device.

FIG. 16 illustrates, by use of isoconcentration lines, simulation results of the impurity concentration in the first impurity region 12 and the second impurity region 14 of the semiconductor device of the first embodiment. Further, FIG. 17 illustrates, by use of isoconcentration lines, simulation results of the impurity concentration in the first impurity region 100, the second impurity region 102, and the boundary region 104 of the comparative semiconductor device. As shown, a region 104a having a very high impurity concentration is formed in the comparative semiconductor device. The semiconductor device of the first embodiment, on the other hand, does not have such a very high impurity concentration region, since the implanted regions for forming the first impurity region 12 and the second impurity region 14 are formed simultaneously by one ion implantation operation, instead of two separate operations, thereby avoiding excessive implantation of holes into the substrate.

Figure 18:
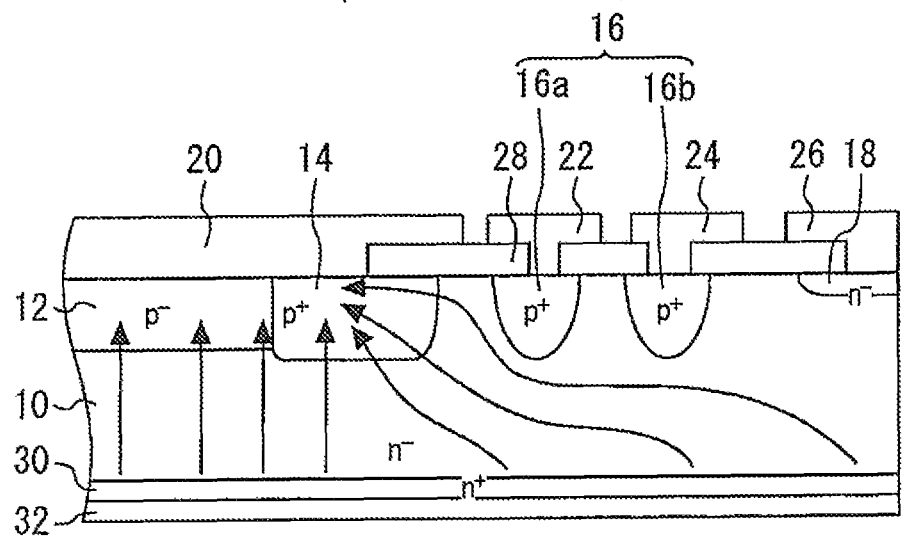
FIG. 18 is cross-sectional view of a portion of the semiconductor device of the first embodiment.

FIG. 18 is a cross-sectional view of a portion of the semiconductor device of the first embodiment, showing the recovery current flowing through the device. The recovery current is represented by arrowed lines in FIG. 18. As shown, the recovery current does not significantly preferentially flow through a particular area, since the semiconductor device does not have a very high impurity concentration region. Further, since the second impurity region 14, in which the recovery current slightly preferentially flows, has a higher impurity concentration than the first impurity region 12, the resistance of the second impurity region 14 is relatively low, thereby preventing overheating, which would otherwise result in a decrease in the SOA of the semiconductor device.

It should be noted that a decrease in the impurity concentration of the first impurity region 12, which serves as an anode region, results in a decrease in the recovery current and hence a decrease in the switching loss of the semiconductor device, but an increase in the steady-state loss of the semiconductor device; that is, there is a trade-off between decreasing the steady-state loss and decreasing the switching loss (or the recovery current). Thus, in order to reduce the recovery current, it is desirable to reduce the impurity concentration of the first impurity region 12. Further, in order to enhance the breakdown voltage of the semiconductor device, it is desirable to increase the impurity concentration of the second impurity region 14. Therefore, the first impurity region 12 and the second impurity region 14 typically have different impurity concentrations.

A second feature of the semiconductor device and method of manufacturing a semiconductor device in accordance with the first embodiment is that the impurity concentration of the first impurity region 12 can be adjusted by varying the aperture ratio r1 of the first portion 52 of the mask 50 described above in connection with the manufacture of the semiconductor device. That is, in accordance with the first embodiment, it is easy to form the first impurity region 12 so as to have a different concentration than the second impurity region 14 by adjusting the aperture ratio r1 of the first portion 52. It should be noted that the aperture ratio r1 of the first portion 52 can be changed merely by changing the size of the first openings 52A of the first portion 52. Therefore, it is possible to increase the impurity concentration of the second impurity region 14 and thereby enhance the breakdown voltage of the semiconductor device while decreasing the impurity concentration of the first impurity region 12 to decrease the recovery current.

Further, the implanted regions 60 and the implanted region 62 for forming the first impurity region 12 and the second impurity region 14, respectively, are formed at once by a single impurity implantation operation, resulting in reduced cost, as compared to when these implanted regions are formed by separate ion implantation operations.

Figure 19:
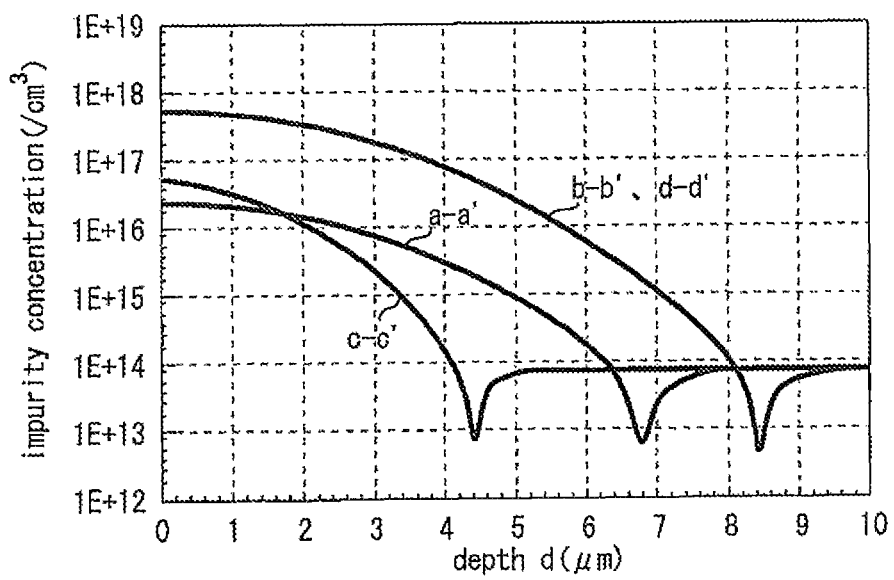
FIG. 19 is a diagram illustrating the impurity concentrations in cross-sections of regions of semiconductor devices as a function of depth.

FIG. 19 is a diagram illustrating the impurity concentrations in cross-sections of regions of semiconductor devices as a function of depth. Specifically, in FIG. 19, curve a-a' represents the impurity concentration distribution in the cross-section of the first impurity region 12 of the semiconductor device of the first embodiment taken along dashed line a-a' of FIG. 1; curve b-b' represents the impurity concentration distribution in the cross-section of the second impurity region 14 of the semiconductor device of the first embodiment taken along dashed line b-b' of FIG. 1; curve c-c' represents the impurity concentration distribution in the cross-section of the first impurity region 100 of the comparative semiconductor device taken along dashed line c-c' of FIG. 13; and curve d-d' represents the impurity concentration distribution in the cross-section of the second impurity region 102 of the comparative semiconductor device taken along dashed line d-d' of FIG. 13.

In the manufacture of the semiconductor device of the first embodiment, the first impurity region 12 and the second impurity region 14 are formed at once in a single thermal diffusion step, whereas in the manufacture of the comparative semiconductor device the first impurity region 100 and the second impurity region 102 are formed in separate thermal diffusion steps (namely, by low temperature thermal diffusion and high temperature thermal diffusion, respectively). As a result, the first impurity region 12 of the semiconductor device of the first embodiment has a different impurity distribution than the first impurity region 100 of the comparative semiconductor device.

Figure 20:
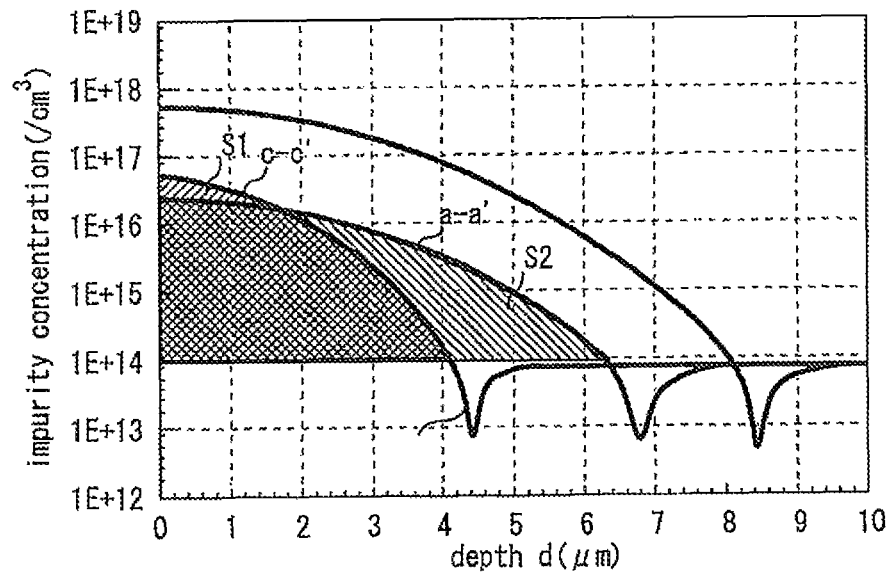
FIG. 20 is identical to FIG. 19, except that some portions are shown hatched.

FIG. 20 is identical to FIG. 19, except that some portions are shown hatched. Specifically, the amount of impurities in the first impurity region 100 of the comparative semiconductor device is represented by a region S1 with right slanted hatching in FIG. 20. The amount of impurities in the first impurity region 12 of the semiconductor device of the first embodiment is represented by a region S2 with left slanted hatching in FIG. 20. The semiconductor device of the first embodiment may be configured so that in FIG. 20 the region S2 is equal in area to the region S1, since in that case the semiconductor device is considered to have the same electrical characteristics as the comparative semiconductor device.

Figure 21:
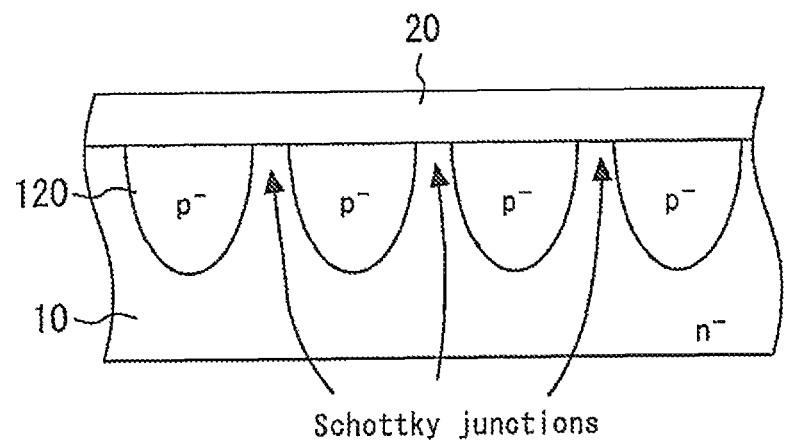
FIG. 21 shows a Schottky junctions formed between the anode electrode and the substrate.

A third feature of the semiconductor device and method of manufacturing a semiconductor device in accordance with the first embodiment is that the anode electrode 20 is formed on the first impurity region 12 and the second impurity region 14 and is not in direct contact with the substrate 10. If the anode electrode 20 is in direct contact with the n-type substrate 10, they will form a Schottky junction(s), resulting in an increase in the amount of leakage current that flows in the semiconductor device when a reverse voltage is applied to the device. FIG. 21 is a cross-sectional view of a portion of a semiconductor device similar to the semiconductor device of the first embodiment, but in which Schottky junctions are formed between the anode electrode 20 and the substrate 10 since the substrate 10 has formed therein a plurality of spaced-apart first impurity regions 120 instead of the first impurity region 12.

A method for reducing leakage current in a semiconductor device (or diode) is to eliminate any Schottky junctions from the design of the semiconductor device, that is, design the semiconductor device to have only PN junctions. In order to achieve this, the semiconductor device of the first embodiment has a wide first impurity region, namely, the first impurity region 12, instead of a plurality of spaced-apart first impurity regions, and the anode electrode 20 extends only over the first impurity region 12 and the second impurity region 14. It should be noted that, in order to form the first impurity region 12 so as to have a configuration as described above, the width X4 of each strip section of the first portion 52 of the mask 50 shown in FIGS. 6 and 7 must be less than twice the lateral diffusion length of the impurities in the first impurity region 12.

In the manufacture of the semiconductor device of the first embodiment, the aperture ratio r1 of the first portion 52 of the mask 50 is adjusted so that the first impurity region 12 will have the desired impurity concentration. Likewise, the aperture ratio of the second portion 54 may be adjusted so that the second impurity region 14 and the guard rings 16a and 16b will have the desired impurity concentration (or the desired amount of impurities implanted therein).

In the semiconductor device of the first embodiment, the conductivity type (if any) of each component may be reversed. That is, in this case, the term "first conductivity type" in the above description refers to p-type conductivity, and the term "second conductivity type" refers to n-type conductivity. Further, although the first impurity region 12 has been described as a region of the p$^-$-type (i.e., a low impurity concentration p-type region) and the second impurity region 14 and the guard rings 16a and 16b have been described as regions of the p$^+$-type (i.e., high impurity concentration p-type regions), it is to be understood that the impurity concentration of each of these regions may be varied depending on the specifications of the semiconductor device to be manufactured.

Although in the present embodiment the semiconductor device has two guard rings (namely, the guard rings 16a and 16b), it is to be understood that in other embodiments the semiconductor device may have any suitable number of guard rings. In such cases, the second portion 54 of the mask 50 described above in connection with the manufacture of the semiconductor device may have a number of third openings corresponding to the number of guard rings to be formed. That is, the second portion 54 may have any suitable number of third openings. Further, the breakdown voltage enhancing structure 16 may be a RESURF structure or a variation lateral doping (VLD) structure instead of being formed of the guard rings 16a and 16b. It should be noted that although in the present embodiment the breakdown voltage enhancing structure 16 is formed together with the first impurity region 12 and the second impurity region 14 in the same process step, it is to be understood that they may be formed in separate steps. The above alterations to the first embodiment may also be made to the subsequently described embodiments.

Second Embodiment

Figure 22:
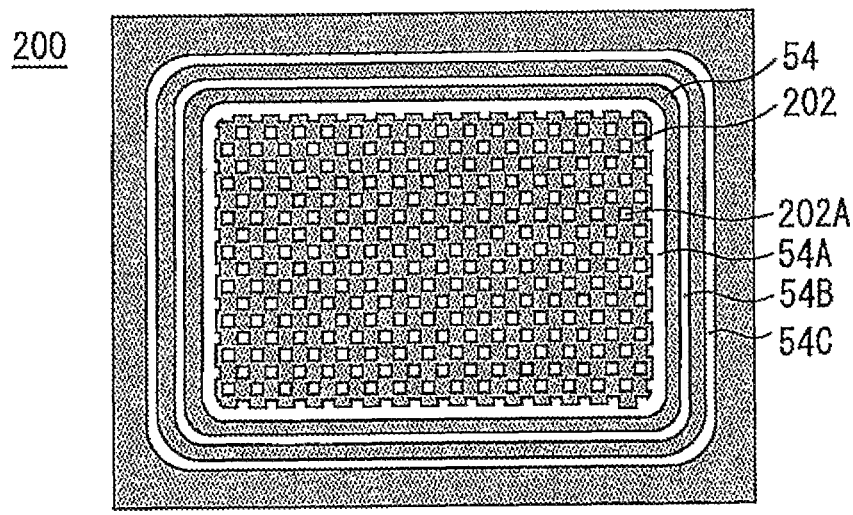
FIG. 22 is a plan view of a mask of the second embodiment.

A second embodiment of the present invention provides a semiconductor device and a method of manufacturing a semiconductor device which have many features common to the semiconductor device and the method of manufacturing a semiconductor device in accordance with the first embodiment. Therefore, the following description of the second embodiment will be primarily limited to the differences from the first embodiment. FIG. 22 is a plan view of a mask 200 of the second embodiment. The mask 200 has a first portion 202 and a second portion 54. The first portion 202 has polygonal first openings 202A. The size and density of the polygonal first openings 202A may be adjusted to adjust the aperture ratio of the first portion 202. Let S represent the area of the first portion 202 and SA1 represent the sum of the areas of the first openings 202A. Then the aperture ratio r2 of the first portion 202 is SA1/S.

The first openings 202A may have any suitable shape so as to facilitate adjustment of the aperture ratio of the first portion 202. For example, the first openings 202A may have a circular shape, or have a shape so that the first portion 202 is made up of a plurality of polygonal mask patterns. It should be noted that the second portion 54 of the mask 200 may have polygonal second openings while the first portion 202 has the polygonal first openings.

Third Embodiment

Figure 23:
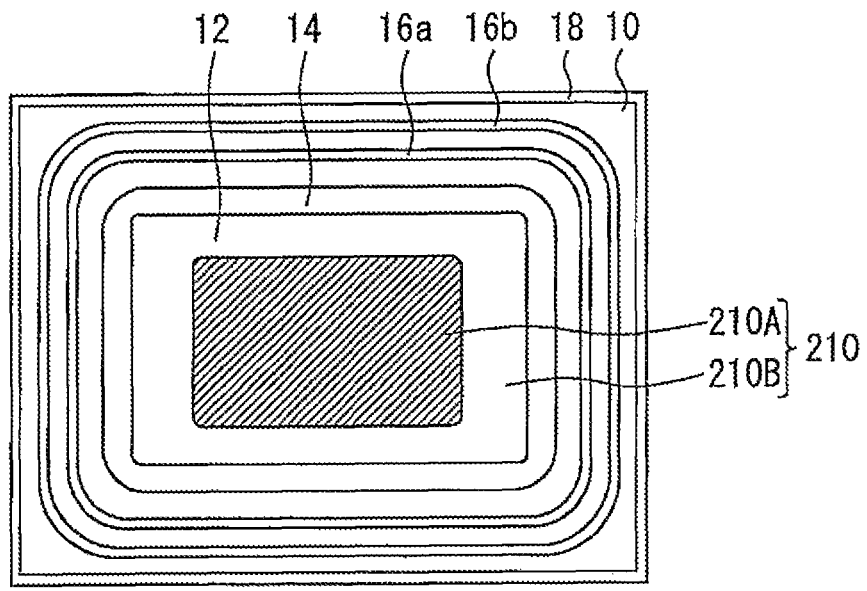
FIG. 23 is a plan view of the semiconductor device of the third embodiment.

A third embodiment of the present invention provides a semiconductor device and a method of manufacturing a semiconductor device which have many features common to the semiconductor device and the method of manufacturing a semiconductor device in accordance with the second embodiment. Therefore, the following description of the third embodiment will be primarily limited to the differences from the second embodiment. FIG. 23 is a plan view of the semiconductor device of the third embodiment. As is the case with FIG. 3, the anode electrode 20, etc. are omitted from FIG. 23 for convenience of illustration. The semiconductor device includes a first impurity region 210 which has a high concentration region 210A having a high impurity concentration and a low concentration region 210B having a lower impurity concentration than the high concentration region 210A. The low concentration region 210B is formed to surround the high concentration region 210A.

Figure 24:
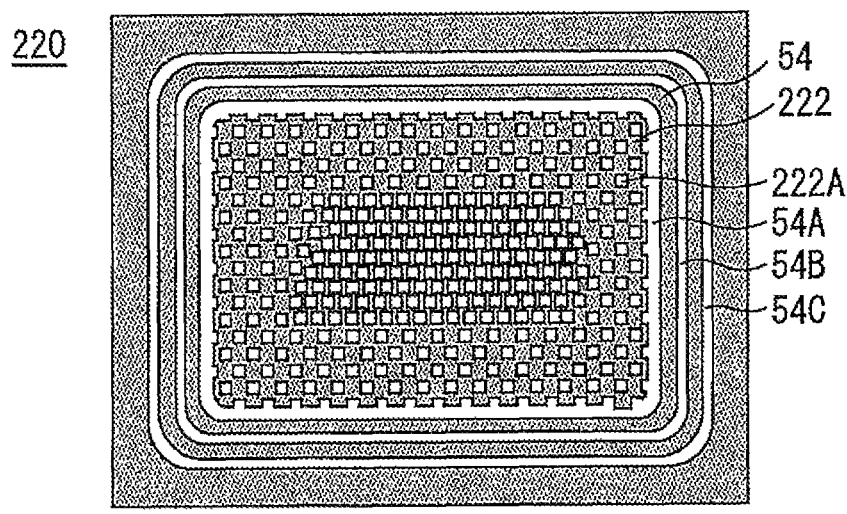
FIG. 24 is a plan view of a mask used in the third embodiment.

A method of manufacturing a semiconductor device in accordance with the third embodiment will be described. FIG. 24 is a plan view of a mask 220 used by this manufacturing method. The mask 220 has a first portion 222 and a second portion 54. The first portion 222 is formed in such a manner that its central portion (as viewed in plan) has a higher aperture ratio than its periphery portion. Specifically, the first portion 222 has a number of first openings 222A therein, and the density of the first openings 222A disposed in the central portion of the first portion 222 is higher than the density of the first openings 222A in the periphery portion. Since the first impurity region 210 is formed using the mask 220, the central portion of the first impurity region 210 (as viewed in plan) has a higher impurity concentration than the outer peripheral portion of the first impurity region 210 (as viewed in plan).

During the forward operation of this semiconductor device (or diode), the carrier density in the high concentration region 210A is high, and the carrier density in the low concentration region 210B is low. It should be noted that the carrier density in the second impurity region 14 is high during the recovery operation, since the carriers which have been accumulated in the substrate 10 during the forward operation are released during the recovery operation. This means that the second impurity region 14 may heat up during the recovery operation due to the heat generated by the periphery portion of the first impurity region 210 if the periphery portion has a high impurity concentration and hence a high current flows through that portion.

In order to avoid this from happening, the low concentration region 210B is formed in the periphery portion of the first impurity region 210 so as to reduce the carrier density in that portion during the forward operation of the semiconductor device. Since the hole current flowing in the low concentration region 210B is low during the recovery operation, the second impurity region 14 does not heat up, resulting in an improved SOA of the semiconductor device.

It should be noted that if the boundary between the high concentration region 210A and the low concentration region 210B has a portion whose impurity concentration is higher than that of the high concentration region 210A, then the hole current flows primarily through that portion. In order to avoid this, it is desirable that the boundary has a maximum impurity concentration equal to or less than that of the high concentration region 210A.

Fourth Embodiment

Figure 25:
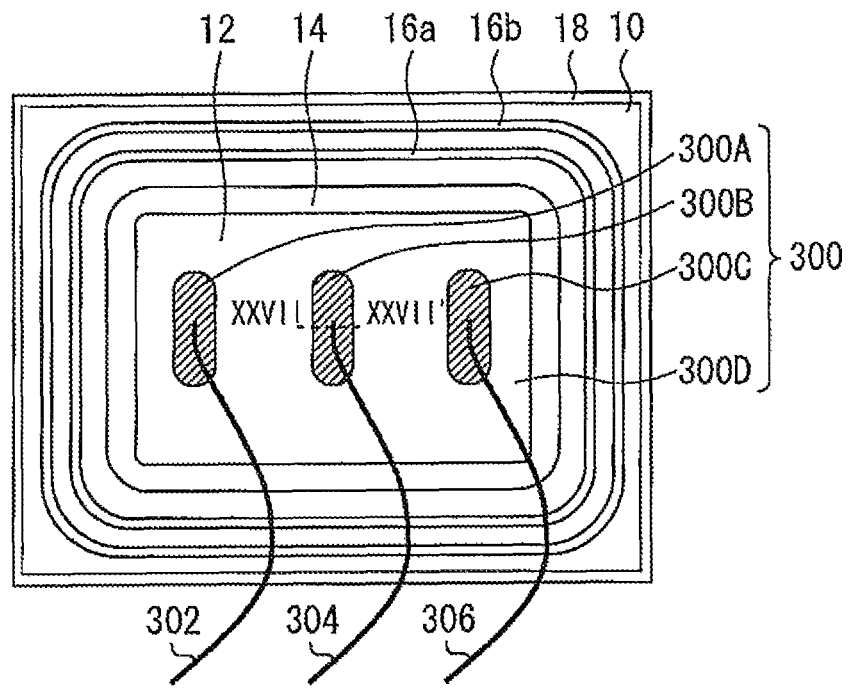
FIG. 25 is a plan view of the semiconductor device of the fourth embodiment.

A fourth embodiment of the present invention provides a semiconductor device and a method of manufacturing a semiconductor device which have many features common to the semiconductor device and the method of manufacturing a semiconductor device in accordance with the third embodiment. Therefore, the following description of the fourth embodiment will be primarily limited to the differences from the third embodiment. FIG. 25 is a plan view of the semiconductor device of the fourth embodiment. As is the case with FIG. 3, the anode electrode 20, etc. are omitted from FIG. 25 for convenience of illustration. The semiconductor device includes a first impurity region 300 which has high concentration regions 300A, 300B, and 300C and a low concentration region 300D having a lower impurity concentration than the high concentration regions 300A, 300B, and 300C.

Figure 26:
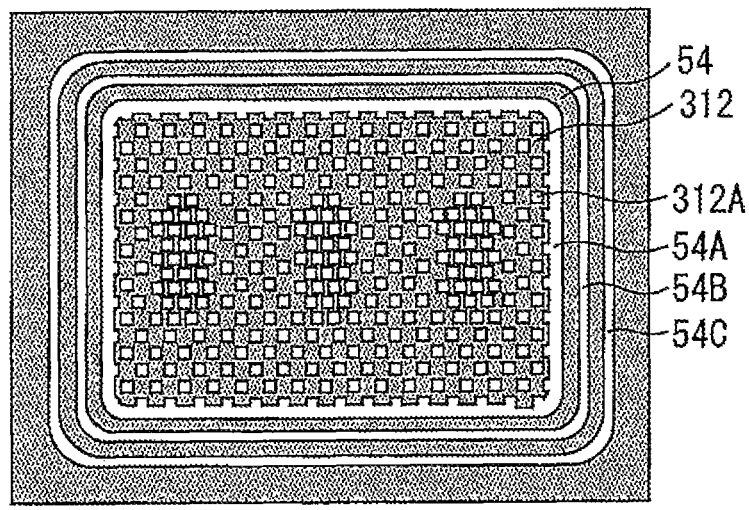
FIG. 26 is a plan view of a mask used in the fourth embodiment.

Wires 302, 304, and 306 are connected and secured to the anode electrode 20 at points directly above the high concentration regions 300A, 300B, and 300C, respectively. FIG. 26 is a plan view of a mask 310 of the fourth embodiment which is used to form the high concentration regions 300A, 300B, and 300C, etc. A first portion 312 of the mask 310 has three portions where a high density of first openings 312A are formed. A large amount of impurities is implanted through these three high density portions into the underlying surface of the substrate 10, thereby forming the high concentration regions 300A, 300B, and 300C, which have a large amount of impurities implanted therein.

Figure 27:
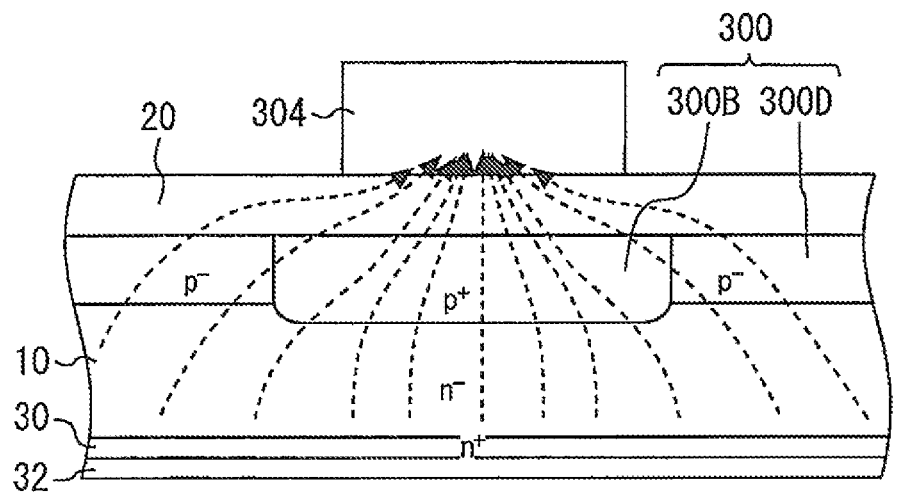
FIG. 27 is a cross-sectional view taken along dashed line XXVII-XXVII' of FIG. 25.

FIG. 27 is a cross-sectional view taken along dashed line XXVII-XXVII' of FIG. 25. The anode electrode 20 is formed on the first impurity region 300. The wire 304, which serves as an external connection wire, is bonded to a portion of the anode electrode 20. The high concentration region 300B is located directly below the wire 304. It should be noted that the current flowing to the wire 304 flows primarily through the portions of the anode electrode 20 and the substrate 10 underlying the wire 304. The portion of the substrate 10 underlying the wire 304 has a relatively low electrical resistance, since the high concentration region 300B is formed therein. The dashed lines in FIG. 27 represent the hole current during the recovery operation of the semiconductor device. As shown, most of the current flowing to the wire 304 flows through the portions of the anode electrode 20 and the substrate 10 underlying the wire 304. However, since the high concentration region 300B has a relatively low resistance, only a minimum amount of heat is generated therein, thus preventing heating up of the semiconductor device and improving its SOA.

It should be noted that if the boundaries between the low concentration region 300D and the high concentration regions 300A, 300B, and 300C have a portion whose impurity concentration is higher than that of the high concentration regions 300A, 300B, and 300C, then the hole current flows primarily through that portion. In order to avoid this, it is desirable that those boundaries have a maximum impurity concentration equal to or less than that of the high concentration regions 300A, 300B, and 300C.

To achieve the advantages described above in connection with the semiconductor device of the fourth embodiment, the fourth embodiment requires only that the high concentration regions 300A, 300B, and 300C be formed directly below the points where the external connection wires are connected to the anode electrode 20. Therefore, the wires 302, 304, and 306 can be any suitable type of external connection wires, e.g., leads. Such leads are soldered to the anode electrode.

Fifth Embodiment

Figure 28:
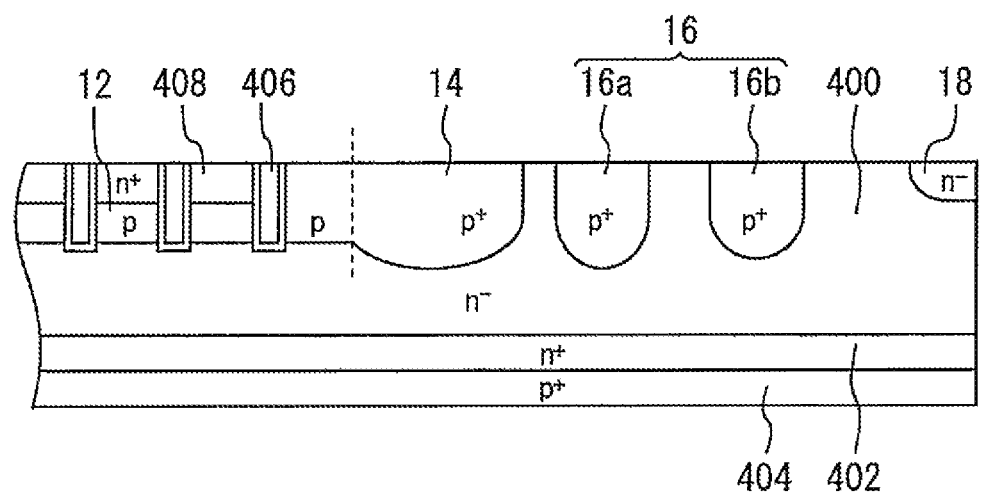
FIG. 28 is a cross-sectional view of a portion of a semiconductor device in accordance with a fifth embodiment.

Although the semiconductor devices of the above embodiments are diodes, it is to be understood that the advantages of the invention may be obtained even when the invention is applied to IGBTs. FIG. 28 is a cross-sectional view of a portion of a semiconductor device in accordance with a fifth embodiment of the present invention. An $n^+$-buffer region 402 is formed on the bottom surface side of the substrate 400 of this semiconductor device. A third impurity region 404 of the second conductivity type is also formed on the bottom surface side of the substrate 400 and is in contact with the $n^+$-buffer region 402. The third impurity region 404 functions as a collector region.

Trench gates 406 are formed in the top surface side of the substrate 400. The substrate 400 has a first impurity region 12 and a second impurity region 14 (which correspond to the first impurity region 12 and the second impurity region 14, respectively, of the first embodiment). An emitter region 408 of the first conductivity type is formed on the first impurity region 12. The trench gates 406 penetrate through the first impurity region 12 and the emitter region 408. The first impurity region 12 functions as a channel region.

Figure 29:
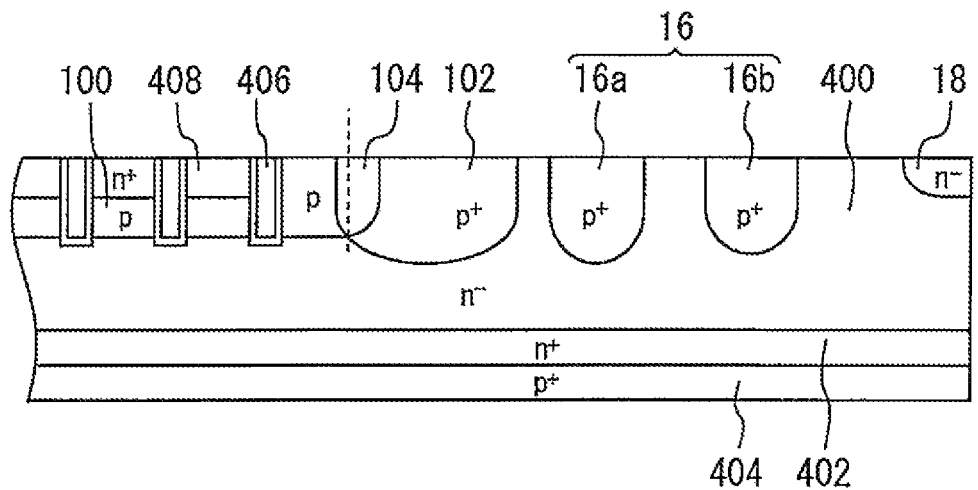
FIG. 29 is a cross-sectional view of a portion of a comparative conventional IGBT.

The first impurity region 12 and the second impurity region 14 are formed in the same process step in such a manner that the boundary between these regions has a relatively low impurity concentration, as is the case with the above first to fourth embodiments. FIG. 29 is a cross-sectional view of a portion of a comparative conventional IGBT. In this IGBT, a boundary region 104 is formed between a first impurity region 100 and a second impurity region 102 and has a higher impurity concentration than these impurity regions.

Thus, the present invention may also be advantageously applied to IGBTs of the same type as the semiconductor device (IGBT) of the fifth embodiment, in which the first impurity region 12 functions as a channel region and the third impurity region 404 functions as a collector region.

Sixth Embodiment

Figure 30:
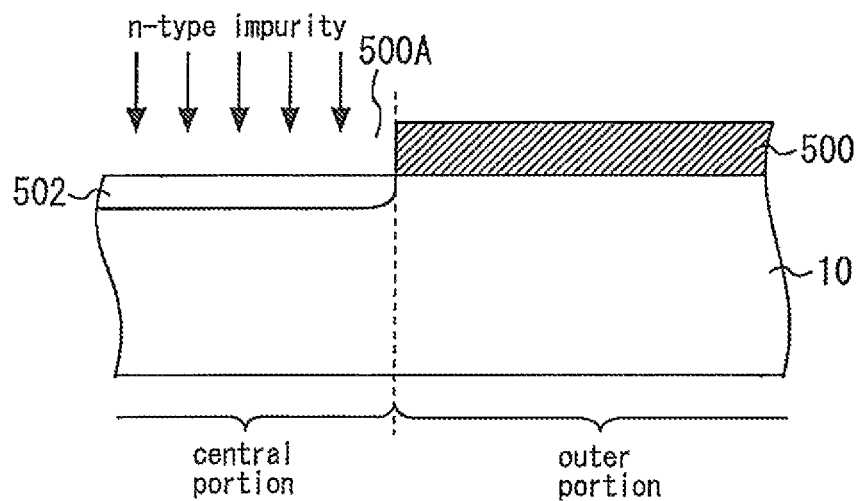
FIG. 30 shows the mask.
Figure 31:
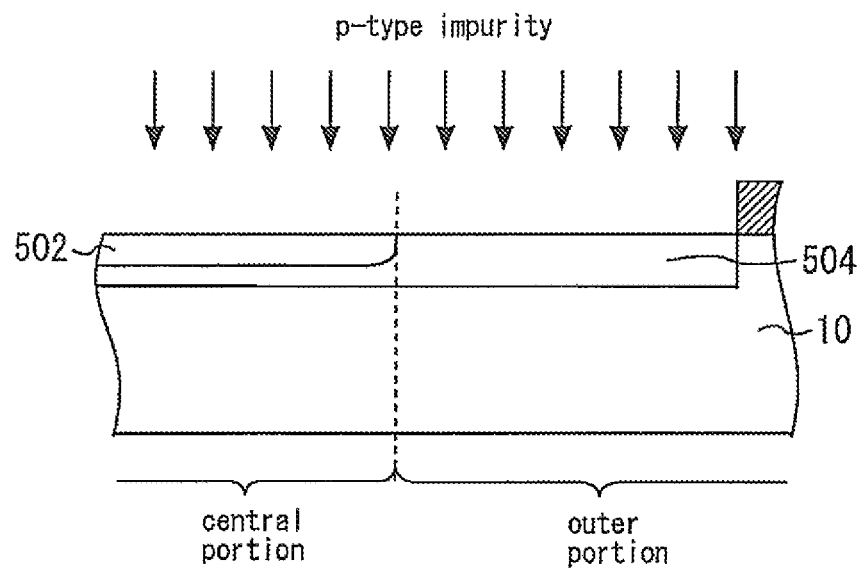
FIG. 31 shows the implanted region.
Figure 32:
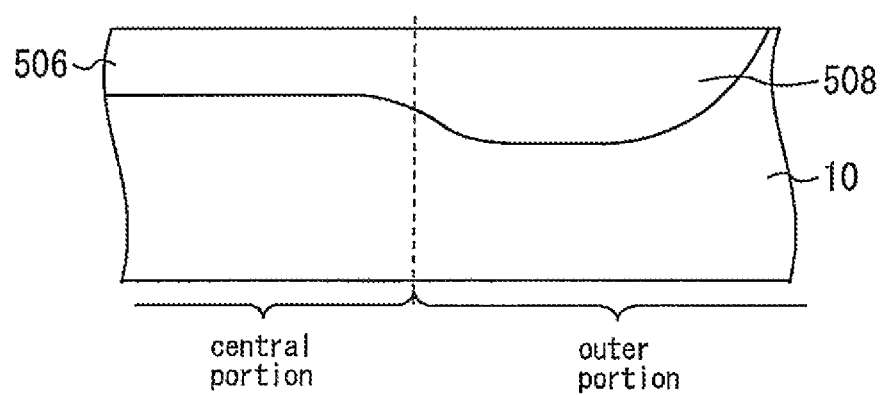
FIG. 32 shows impurities after thermal diffusion.

In the manufacture of the semiconductor devices of the above first to fifth embodiments, the first and second impurity regions are formed at once by one ion implantation operation in such a manner that the boundary between these regions has a relatively low impurity concentration. It should be noted, however, that a different method may be used to form the first and second impurity regions while minimizing the impurity concentration of the boundary between these regions. FIGS. 30 to 32 are cross-sectional views of portions of partially completed semiconductor devices, showing a method of manufacturing a semiconductor device in accordance with a sixth embodiment of the present invention. This manufacturing method begins by forming a mask 500 on the surface of a substrate 10 of the first conductivity type, with the mask 500 having a first opening 500A exposing a central portion of the substrate 10, as shown in FIG. 30. Next, the central portion of the substrate 10 is implanted with a first impurity of n-type (or the first conductivity type) using the mask 500, thereby forming an implanted region 502.

The mask 500 is then removed. Next, the central portion and the surrounding outer portion of the substrate 10 are implanted with a second impurity of p-type (or the second conductivity type) so as to form an implanted region 504 having a higher impurity concentration than the implanted region 502. FIG. 31 is a cross-sectional view of a portion of the partially completed semiconductor device shown in FIG. 30 after the implanted region 504 has been formed therein.

The method then proceeds to a thermal diffusion step. FIG. 32 is a cross-sectional view of a portion of the partially completed semiconductor device shown in FIG. 31 after the thermal diffusion step has been completed. In this thermal diffusion step, the implanted regions 502 and 504 are thermally diffused so that a first impurity region 506 of the second conductivity type is formed in the central portion of the substrate 10 and so that a second impurity region 508 of the second conductivity type is formed which laterally surrounds and is in contact with the first impurity region 506 and which has a greater depth than the first impurity region 506, as viewed in cross-section. The first impurity region 506 functions as an anode region, and the second impurity region 508 functions as a well region. A breakdown voltage enhancing structure may be formed in the substrate, as necessary.

As a result of the manner in which the first impurity region 506 and the second impurity region 508 are formed, the boundary between these regions has a maximum impurity concentration equal to or less than that of the second impurity region 508. Furthermore, since the implanted region 502 of the first conductivity type is formed in the central portion of the substrate 10 before the formation of the implanted region 504 of the second conductivity type, the subsequent formation of the first impurity region 506 and the second impurity region 508 by thermal diffusion results in the first impurity region 506 having a lower concentration of second conductivity type impurities than the second impurity region 508.

Figure 33:
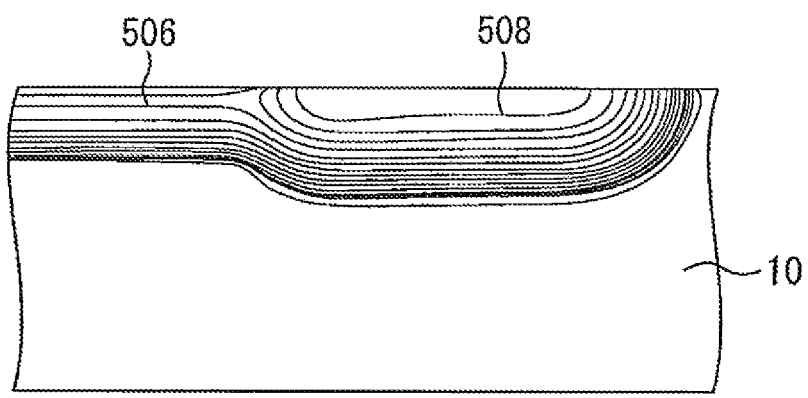
FIG. 33 shows a simulation result of the structure shown in FIG. 32.

FIG. 33 illustrates, by use of isoconcentration lines, simulation results of the second conductivity type impurity concentration in the structure shown in FIG. 32. As shown, the boundary between the first impurity region 506 and the second impurity region 508 has a relatively low impurity concentration. It should be noted that features of embodiments described above may be combined where appropriate.

The present invention enables the active region and the well region of a semiconductor device to be formed in such a manner as to prevent increase in the impurity concentration at the boundary between these regions.

Obviously many modifications and variations of the present invention are possible in the light of the above teachings. It is therefore to be understood that within the scope of the appended claims the invention may be practiced otherwise than as specifically described.

What is claimed is:
1. A semiconductor device comprising:
a substrate of a first conductivity type;
a first impurity region of a second conductivity type formed on a top surface side of said substrate;
a second impurity region of said second conductivity type formed on said top surface side of said substrate and in contact with said first impurity region, said second impurity region laterally surrounding said first impurity region and having a greater depth than said first impurity region, as viewed in cross-section; and a breakdown voltage enhancing structure of said second conductivity type formed to laterally surround said second impurity region;

wherein a boundary between said first and second impurity regions has a maximum impurity concentration equal to or less than that of said second impurity region, and a current is applied between a top surface and a bottom surface of said substrate.

2. The semiconductor device according to claim 1, further comprising an electrode which is formed on said first impurity region and which is not in contact with any portion of said substrate other than said first impurity region or said second impurity region or both.

3. The semiconductor device according to claim 1, wherein said second impurity region has a higher impurity concentration than said first impurity region.

4. The semiconductor device according to claim 1, wherein a central portion of said first impurity region, as viewed in plan, has a higher impurity concentration than an outer peripheral portion of said first impurity region, as viewed in plan.

5. The semiconductor device according to claim 1, further comprising an electrode formed on said first impurity region and an external connection wire secured to a portion of said electrode, wherein a portion of said first impurity region directly below said external connection wire has a higher impurity concentration than any other portion of said first impurity region.

6. The semiconductor device according to claim 1, further comprising an anode electrode formed on said first impurity region and a cathode electrode formed on a bottom surface side of said substrate, wherein said semiconductor device forms a diode in which said first impurity region serves as an anode region.

7. The semiconductor device according to claim 1, further comprising a third impurity region of said second conductivity type formed on a bottom surface side of said substrate and a trench gate formed in said top surface side of said substrate, wherein said semiconductor device forms an IGBT in which said first impurity region serves as a channel region and said third impurity region serves as a collector region.

8. The semiconductor device according to claim 1, wherein said breakdown voltage enhancing structure is a guard ring, a RESURF structure, or a VLD structure.

* * * * *